United States Patent [19]
Cheng et al.

[11] Patent Number: 5,969,646
[45] Date of Patent: Oct. 19, 1999

[54] APPARATUS AND METHOD FOR DECODING DIFFERENTIAL MULTI-LEVEL DATA WITH ADAPTIVE THRESHOLD CONTROL

[75] Inventors: Yi Cheng, San Jose; Zhenhua Liu, Sunnyvale; Kris Martin Holt, Pleasanton, all of Calif.

[73] Assignee: Advanced Micro Devices, Inc., Sunnyvale, Calif.

[21] Appl. No.: 09/047,439

[22] Filed: Mar. 25, 1998

[51] Int. Cl.[6] .............................. H03M 5/08; H04L 25/34
[52] U.S. Cl. .............................................. 341/53; 375/289
[58] Field of Search .................................. 341/56, 68, 57, 341/69, 53; 327/263, 264; 375/286, 287, 289

[56] References Cited

U.S. PATENT DOCUMENTS

| | | | |
|---|---|---|---|
| 5,378,946 | 1/1995 | Reime | 327/14 |
| 5,459,749 | 10/1995 | Park | 375/286 |
| 5,799,043 | 8/1998 | Chang et al. | 375/286 |

*Primary Examiner*—Howard L. Williams
*Assistant Examiner*—Peguy Jean-Pierre

[57] ABSTRACT

An improved decoder for recovering Non-Return-to-Zero Interface (NRZI) digital data from a multiple layer transition (MLT-3) encoded signal in a 100BASE-TX Ethernet (IEEE Standard 802.3u) uses multiple comparators to minimize jitter in the decoded signal. A CMOS-based biasing circuit receives the differential MLT-3 encoded input signals and control signals from a signal amplitude detection circuit. The biasing circuit adjusts for any DC offset, and also generates offset signals based on respective mid-peak voltage values of the respective differential input signals. Four comparators are then used to detect a prescribed edge transition (e.g., a positive edge) coinciding with the respective mid-peak voltage value in the respective signals. The detected edge transitions are then used by edge decoding logic to generate the NRZI bilevel signal.

23 Claims, 5 Drawing Sheets

Fig. 1A (Prior Art)
Fig. 1B (Prior Art)
Fig. 1C (Prior Art)
Fig. 2A (Prior Art)
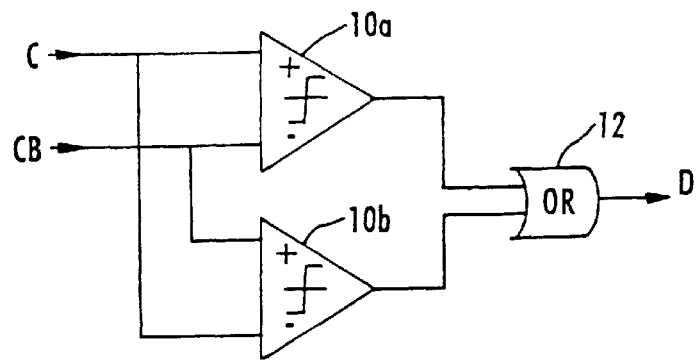
Fig. 2B (Prior Art)
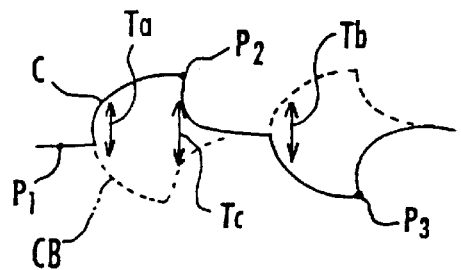
Fig. 2C (Prior Art)

APPARATUS AND METHOD FOR DECODING DIFFERENTIAL MULTI-LEVEL DATA WITH ADAPTIVE THRESHOLD CONTROL

BACKGROUND OF THE INVENTION

1. Technical Field

The present invention relates to decoders for recovering digital data from a transmitted analog signal, more particularly to a multiple layer transition (MLT-3) decoder configured for receiving a 125 Mb/s MLT-3 encoded signal from a 100BASE-TX Ethernet (IEEE Standard 802.3u) transmission medium for decoding into a two-level Non-Return to Zero Interface (NRZI) digital signal in a physical layer transceiver.

2. Background Art

Local area networks use a network cable or other network media to link nodes (e.g., workstations, routers and switches) to the network. Each local area network architecture uses a media access control (MAC) enabling network interface device at each network node to share access to the media.

Physical (PHY) layer devices are configured for translating digital packet data received from a MAC across a standardized interface, e.g., a Media Independent Interface (MII), into an analog signal for transmission on the network medium, and reception of analog signals transmitted from a remote node via the network medium. An example is the 100BASE-TX Ethernet (IEEE Standard 802.3u) receiver, configured for receiving a three-level MLT-3 encoded analog signal at a 125 Mb/s data rate. For example, FIGS. 1A, 1B and 1C are diagrams illustrating an original NRZI-encoded digital signal for transmission on the media, an encoded MLT-3 signal generated at the transmitting PHY layer for transmission on the network medium, and an MLT-3-encoded analog signal having been transmitted by the network medium and received by a PHY transceiver at a destination node. As shown in FIG. 1A, the original bilevel digital signal, encoded as an NRZI signal, is encoded into the three-level MLT-3 signal of FIG. 1B before transmitting the digital information to the receiving station. On the receiving side, the MLT-3 encoded signal of FIG. 1B encounters transmission loss, for example high frequency attenuation, resulting in the received MLT-3 signal of FIG. 1C. Hence, the 100BASE-TX Ethernet (IEEE 802.3u) receiver must recover the digital information from the received MLT-3 signal of FIG. 1C.

FIGS. 2A, 2B and 2C illustrate one proposal for recovering the NRZI signal from the received MLT-3 signal. In particular, FIG. 2A is a diagram illustrating a prior art decoder that decodes the received MLT-3 signal of FIG. 2B to obtain the NRZI signal of FIG. 2C. As shown in FIG. 2A, the prior art decoder includes two comparators 10a and 10b, and an OR gate 12 to convert the received MLT-3 signal into an NRZI-format signal. Specifically, each comparator 10 receives the received MLT-3 signal (C) and an inverted copy of the received MLT-3 signal (CB), where the signal CB has an inverse polarity relative to signal C, as shown in FIG. 2B. In particular, comparator 10a receives the C signal and the CB signal at a non-inverting input and an inverting input, respectively, whereas comparator 10b receives the C signal and the CB signal at inverting and non-inverting inputs, respectively. The comparators 10a and 10b are positive edge triggered, hence the comparators output a logical zero (e.g., no signal) if the values of C and CB are equal (e.g., equal to zero volts). If the signal C exceeds signal CB by a prescribed threshold $T_a$, as shown in FIG. 2B, the comparator 10a outputs a comparison signal 14 as a logical 1. In contrast, if signal CB exceeds signal C by a prescribed threshold $Tb$, the comparator 10b outputs a comparison signal 16 as a logical 1 to the OR gate 12.

Although the decoder circuit of FIG. 2A is relatively easy to implement, the circuit of FIG. 2A encounters numerous problems in actual implementation. Noise encountered during the transmission of the MLT-3 encoded signal requires that the threshold values of the comparators 10a and 10b be set to a non-zero value. The ideal comparator threshold is half of the peak value, namely between the middle point $P_1$ and the positive/negative peaks $P_2/P_3$. In practical design, however, such a comparator with controlled thresholds that can adapt to signal peak values is not easy to implement in the circuit of FIG. 2A.

In addition, the MLT-3 signal of FIG. 2B, having encountered high frequency attenuation during transmission, has slow rise-fall edges, e.g., a degraded slew rate. Hence, each comparator 10a, 10b will also generate an output signal 14, 16 having a reduced slew rate as a signal edge, as opposed to the ideal instantaneous (i.e., vertical edge). In addition, the precise point at which the input MLT-3 signals C and CB cross the thresholds $T_a$ and $T_b$ is varied due to the attenuated slew rate. Variations in the threshold voltage also affect the precise point at which the input signals C and CB cross the threshold. Hence, the precise location of the leading edge of the MLT-3 encoded signal as shown in FIG. 1B is difficult to identify.

Moreover, conventional comparators have threshold hysteresis, where the comparators do not have identical rising-edge thresholds and falling-edge thresholds. Hence, if the rising-edge threshold ($T_a$) is set at a peak voltage divided by 2 (e.g., 50 milli-volts), the falling-edge threshold ($T_c$) may have a different value (e.g., 45 milli-volts) that affects when the comparator output signal is turned off. For example, if the rising-edge threshold is slower (e.g., 50 milli-volts) than the falling-edge threshold (e.g., 45 milli-volts), the resulting pulsewidth of the comparator signal will be narrower than ideal; conversely, if the rising-edge threshold is faster (e.g., 40 milli-volts) than the falling-edge threshold (e.g., 45 milli-volts), the resulting pulsewidth of the comparator signal will be wider than ideal. Hence, the threshold hysteresis present in comparators adversely affects the pulsewidth of the pulse 14 and 16 output by the comparators 10a and 10b, respectively.

These factors cause the comparators 10a and 10b to output a comparison signal at variable times, which introduces timing variations (i.e., jitter) into the decoded NRZI signal of FIG. 2C. Hence, the decoded NRZI signal may include jitter that may affect the accurate detection of the network clock, as well as accurate detection of the decoded data in a synchronous system.

FIGS. 3A and 3B illustrate an alternative MLT-3 decoder. The decoder of FIG. 3A includes buffers 14a and 14b, for example a unit-gain amplifier, and voltage offset supply sources 16a and 16b. Hence, the voltage sources 16a and 16b output the signals $C_o$ and $CB_o$, respectively, as shown in FIG. 3B. Use of the unit-gain amplifiers 14 enables addition of a DC offset, which adds a degree of noise immunity to the comparators 18a and 18b, reducing the required threshold values. However, the additional stage of buffers 14a and 14b increases the propagation delay and reduces the input bandwidth of the decoder circuit, becoming a critical issue in relatively low speed CMOS circuit implementations, especially for 100BASE-TX Ethernet (IEEE 802.3u) applications.

FIGS. 4A and 4B illustrate still another conventional approach for performing MLT-3 decoding. Specifically, the MLT decoding circuit of FIG. 4A includes comparators 20a and 20b, where potential sources 22a and 22b are set according to the decoder threshold and the amplitudes of the differential input signals C and CB. However, the circuit of FIG. 4A provides poor performance of common mode noise rejection, unless the respective potentials P1 and P2 of voltage sources 22a and 22b can be derived to track the common mode noises in signals C and CB. In addition, bandwidth limitations are encountered if the decoder circuit of FIG. 4A is implemented in CMOS.

SUMMARY OF THE INVENTION

There is a need for an arrangement for decoding a differential pair of multiple level signals into a bilevel signal in a manner that avoids the effect of comparator threshold hysteresis inherent in comparators.

There is also a need for an arrangement for performing MLT-3 decoding for a 100BASE-TX receiver, that decodes the received MLT-3 signal into a bilevel NRZI signal with minimal introduction of jitter.

There is also a need for an arrangement that decodes a differential pair of multiple level signals into a bilevel signal that enables high speed decoding of 125 MHz data rate signals to be decoded using CMOS processes.

There is also a need for an arrangement for decoding a differential pair of multiple level signals into a bilevel signal in a manner that precisely defines edge transitions relative to prescribed thresholds in a manner that minimizes jitter in the decoded signal.

These and other needs are attained by the present invention, where a differential pair of multiple level signals including a primary multiple level signal and an inverted multiple level signal, are decoded into a bilevel signal based on generation of offset signals, and detection of decoding points between the differential pair of multiple level signals and the offset signals. The decoding points are detected by comparator circuits, each configured for outputting a comparison signal in response to a detection of a prescribed edge transition in a corresponding one of the multiple level signals or offset signals. The comparison signals are then used to generate one-shot pulses that identify the decoding points, enabling generation of the bilevel signal based on prescribed edge transitions in the multiple level signals and the offset signals coinciding with the respective decoding points.

According to one aspect of the present invention, a decoder is configured for decoding a differential pair of multiple level signals, including a primary multiple level signal and an inverted multiple level signal, into a bilevel signal. The decoder comprises a biasing circuit for offsetting the primary multiple level signal and the inverted multiple level signal by respective mid-peak voltage values and in response outputting respective offset multiple level signals including an offset primary multiple level signal and an offset inverted multiple level signal. The decoder also includes a plurality of comparator circuits, each configured for outputting a comparison signal in response to detection of a prescribed edge transition crossing the corresponding mid-peak voltage value in a corresponding one of the multiple level signal, the inverted multiple level signal, the offset multiple level signal, and the offset inverted multiple level signal. The decoder also includes edge detection circuits, each configured for detecting a prescribed edge transition in a corresponding one of the comparison signals, and edge decoding logic for outputting the bilevel signal in response to the detected edge transitions in the comparison signals. Generation of the offset multiple level signals enables the comparator circuits to accurately detect the edge transitions, since the combined slew rate of the signals input to the comparator circuits is twice the rate encountered in the prior art decoder circuits. Moreover, the use of the comparator circuits to detect a prescribed edge transition for the respective multiple level signals, for example a rising-edge or falling-edge, ensures that each comparator circuit is optimized for the prescribed edge transition, minimizing the effects of threshold hysteresis. Moreover, the use of each comparator circuit to detect the same edge transition in different signals ensures that any threshold inaccuracies are spread out over all the edge transitions, nullifying the effects in the decoded bilevel signal.

Another aspect of the present invention provides a decoder for decoding, into a bilevel signal, a differential pair of multiple level signals including a primary multiple level signal and an inverted multiple level signal, the decoder comprising a voltage biasing circuit for offsetting the primary multiple level signal and the inverted multiple level signal as an offset primary multiple level signal and an offset inverted multiple level signal, respectively, based on detected voltage characteristics of the primary multiple level signal and the inverted multiple level signal. The decoder circuit also includes four comparator circuits. In particular, a first comparator circuit is configured for outputting a first comparison signal in response to the primary multiple level signal having a value greater than the offset inverted multiple level signal. The second comparator circuit is configured for outputting a second comparison signal in response to the offset primary multiple level signal having a value greater than the inverted multiple level signal. The third comparator circuit is configured for outputting a third comparison signal in response to the offset inverted multiple level signal having a value greater than the primary multiple level signal, and the fourth comparator circuit is configured for outputting a fourth comparison signal in response to the inverted multiple level signal having a value greater than the offset primary multiple level signal. The decoder also includes edge detection circuits, each configured for detecting a prescribed edge transition in a corresponding one of the comparison signals, and edge decoding logic for outputting the bilevel signal in response to the detected edge transitions in the comparison signals. Use of the multiple comparator circuits ensures accurate detection of the prescribed edge transition, since the edge transition is defined by changes in both input signals to the comparator, effectively providing a crossover rate twice that encountered in the prior art decoder circuits. In addition, the use of a comparator to identify a single transition every two cycles increases the operational speed of the decoder circuit by four times over conventional decoder circuits, enabling the relatively slow CMOS technology to be used for high speed data decoding.

Still another aspect of the present invention provides a method for decoding a differential pair of multiple level signals, including a primary multiple level signal and an inverted multiple level signal, into a bilevel signal. An offset primary multiple level signal is generated based on the inverted multiple level signal, and an offset inverted multiple level signal is generated based on the primary multiple level signal. First and second decoding points are detected based on respective first and second intersection points between the primary multiple level signal and the offset inverted multiple level signal. Third and fourth decoding points are detected based on respective third and fourth intersection points between the inverted multiple level signal and the offset primary multiple level signal. The bilevel signal is generated based on prescribed edge transitions in the primary multiple level signal, the offset inverted multiple level signal, the inverted multiple level signal and the offset primary multiple level signal coinciding with the first, second, third, and fourth decoding points, respectively.

Additional objects, advantages and novel features of the invention will be set forth in part in the description which follows, and in part may become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein:

FIGS. 1A, 1B, and 1C are diagrams illustrating an NRZI-encoded signal, an encoded MLT-3 signal generated by a transmitting station, and an MLT-3 signal at a receiving station having encountered propagation losses, respectively.

FIGS. 2A, 2B, and 2C are diagrams illustrating a prior art MLT-3 decoder, a received MLT-3 signal, and the decoded output signal, respectively.

BEST MODE FOR CARRYING OUT THE INVENTION

Figure 3A:
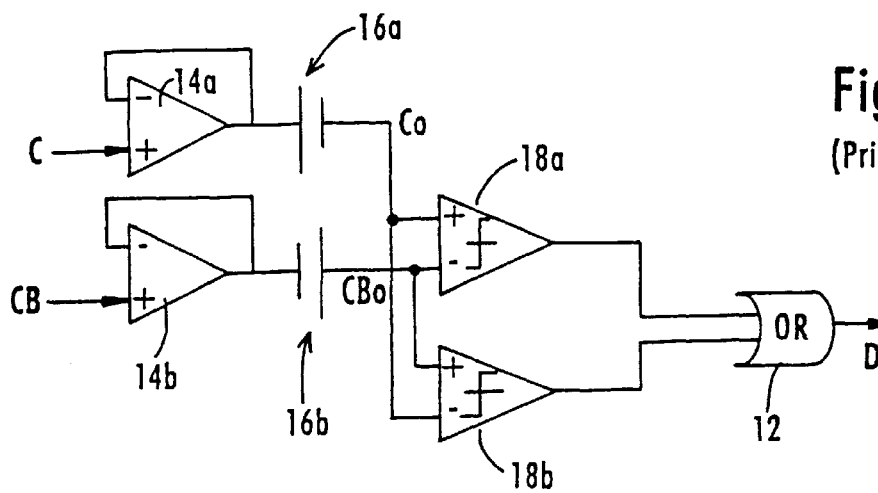
FIGS. 3A and 3B are diagrams illustrating an alternative prior art MLT-3 decoder and offset signals generated during decoding, respectively.
Figure 3B:
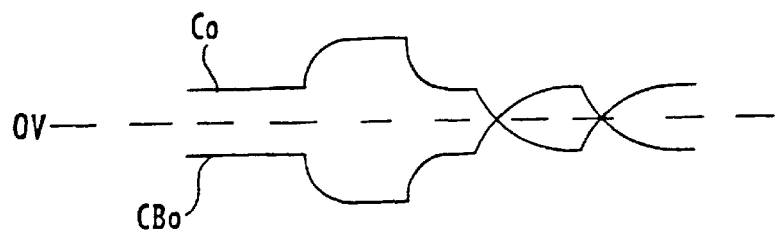
Figure 4A:
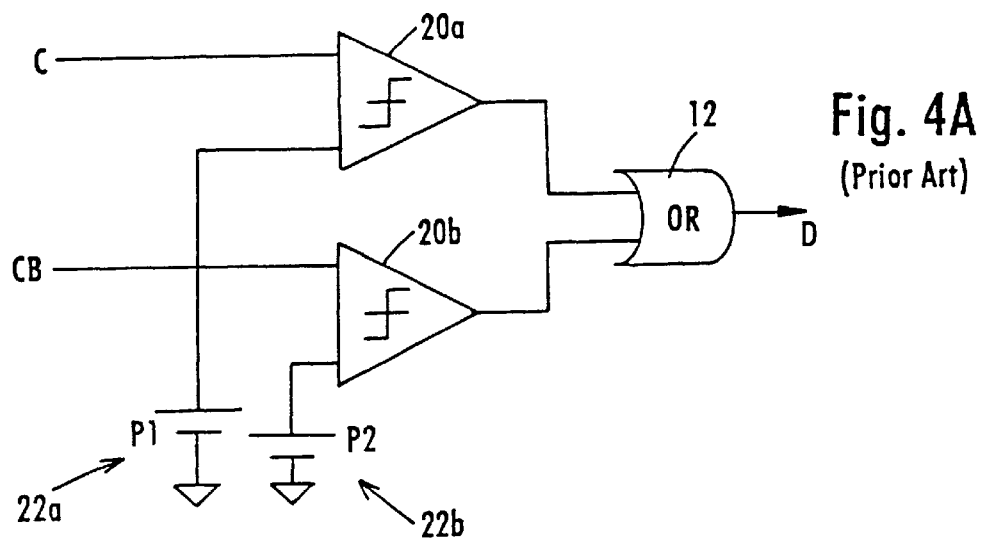
FIGS. 4A and 4B are diagrams illustrating another prior art decoder and an MLT-3 signal decoded relative to fixed threshold voltages, respectively.
Figure 4B:
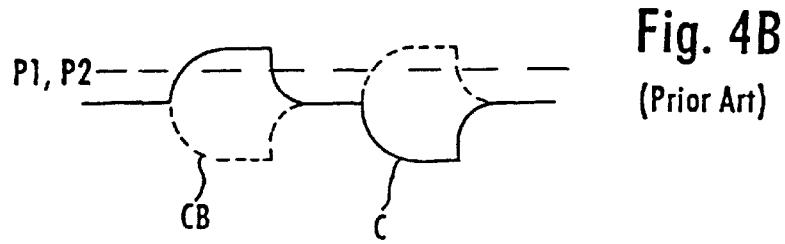
Figure 5:
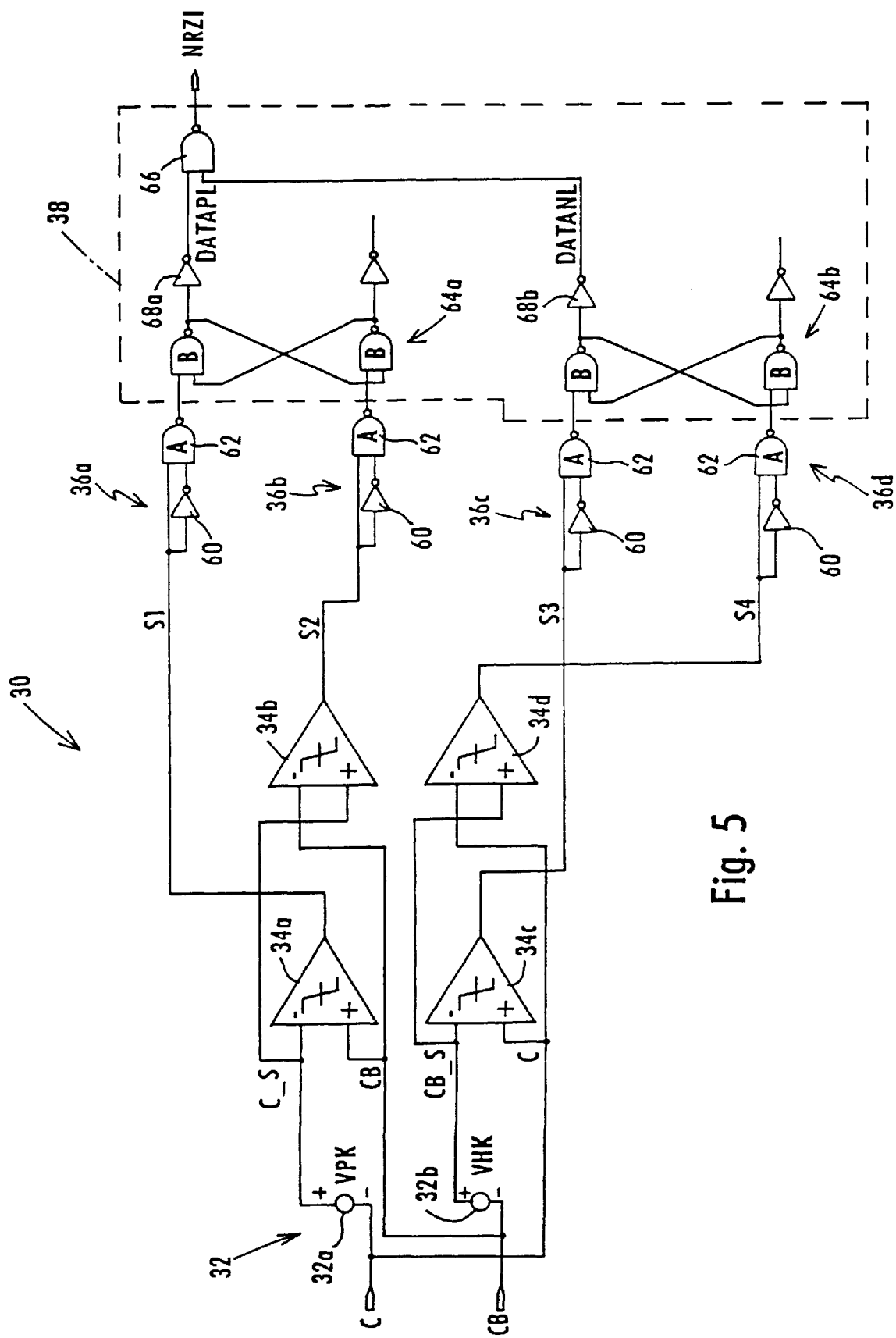
FIG. 5 is a block diagram illustrating a decoder for decoding a multiple level signal into a bilevel signal according to an embodiment of the present invention.
Figure 8:
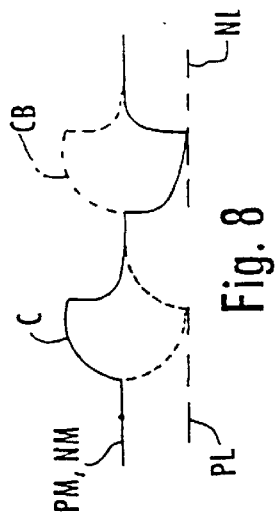
FIG. 8 is a diagram illustrating the relationship between the input multiple level signals and supplied voltage signals characterizing the multiple level signals as used by the circuit of FIG. 6.

FIG. 5 is a block diagram illustrating a decoder for decoding a differential pair of multiple level signals, for example MLT-3 encoded signals, into a bilevel signal such as an NRZI signal according to an embodiment of the present invention. As described in detail below, the decoder of FIG. 5 receives a primary multiple level signal (C) and an inverted multiple level signal (CB), as shown in FIG. 8. The decoder of FIG. 5 includes a biasing circuit configured for offsetting the primary multiple level signal (C) and the inverted multiple level signal (CB) by respective mid-peak voltage values, and in response outputting offset multiple level signals including an offset primary multiple level signal (C_S) and an offset inverted multiple level signal (CB_S).

The biasing circuit 32 outputs the multiple level signals C and CB and the offset multiple level signals C_S and CB_S to a plurality of comparator circuits 34. Each comparator circuit 34 is configured for outputting a comparison signal in response to detection of a prescribed edge transition crossing the corresponding mid-peak voltage value in a corresponding one of the supplied signals. The decoder circuit 30 also includes edge detection circuits 36, each configured for detecting a prescribed edge transition in the corresponding comparison signal. Each edge detection circuit generates a one-shot pulse that identifies a decoding point in response to detection of the prescribed edge transitions in the corresponding comparison signals.

The decoder 30 also includes edge decoding logic 38 for outputting the bilevel signal in response to the detected edge transitions in the comparison signal as identified by the one-shot pulses from the edge detection circuits 36.

As shown in FIG. 5, the primary multiple level signal (C) and the inverted multiple level signal (CB) are supplied to the biasing circuit 32 for generation of the offset multiple level signals C_S and CB_S, described in detail below with respect to FIG. 6. The biasing circuit is illustrated in FIG. 5 as voltage sources 32a and 32b, which add an offset to the signals C and CB based on respective mid-peak voltage values as detected by a signal amplitude detection circuit (not shown).

The multiple level signals (C and CB) and the offset multiple level signals (C_S and CB_S) are then selectively supplied to the comparators 34 for detecting decoding points based on intersection points between the respective input signals. In other words, the comparators 34 detect a prescribed edge transition (e.g., a positive edge or a negative edge) in a selected one of the input signals that crosses a corresponding mid-peak voltage value based on the other input signal to the comparator.

Figure 7:
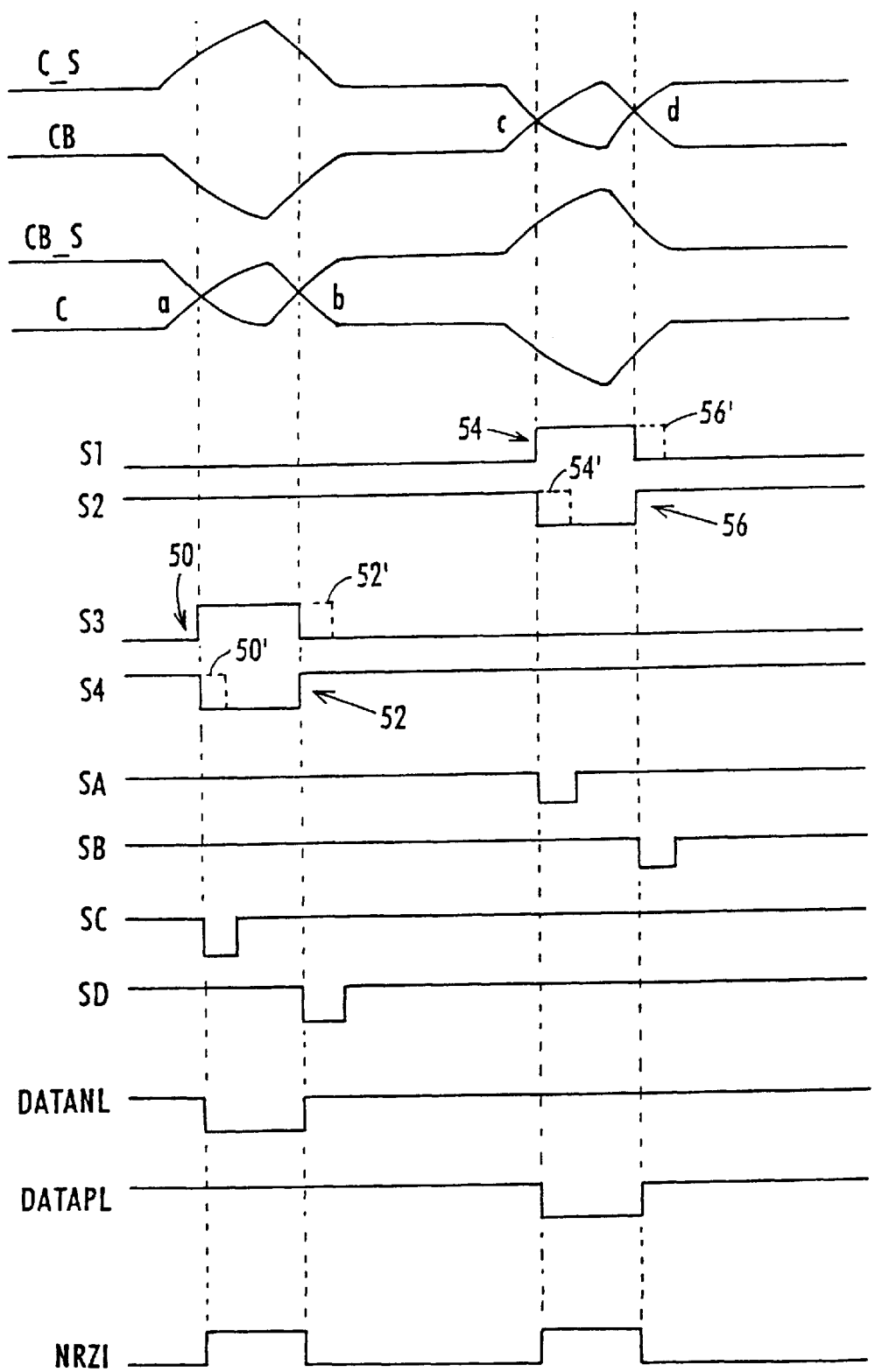
FIG. 7 is a diagram illustrating the signals generated by the decoding circuit of FIG. 5 during generation of the bilevel signal according to an embodiment of the present invention.

As described below, the value of the voltage shifts by the voltage sources 32a and 32b are chosen such that after the voltage level shifts, the relationship between signals CB and C_S, and between signals C and CB_S, define a decoding point as a prescribed edge transition (e.g., a positive edge) crossing a mid-peak voltage value. For example, FIG. 7 illustrates the relationship between the multiple level signals C and CB and the offset multiple level signals C_S and CB_S with respect to the comparators 34. Each of the comparators 34 is implemented as a positive edge-triggered comparator, such that a comparator circuit 34 outputs a comparison signal in response to an input signal at the positive terminal having a voltage greater than the input signal at the corresponding negative terminal.

As shown in FIG. 5, comparators 34a and 34b each receive the inverted multiple level signal CB and the offset primary multiple level signal C_S for detection of the decoding points C and D of FIG. 7. For example, comparator 34a receives the inverted multiple level signal CB and the offset primary multiple signal C_S at the positive and negative terminals, respectively. As shown in FIG. 5, the input polarities before comparators 34a and 34b are opposite each other. Similarly, comparators 34c and 34d each receive the primary multiple level signal C and the offset inverted multiple level signal CB_S according to the respective input polarities.

The comparators 34c, 34d, 34a, and 34b detect the intersection points a, b, c, and d of FIG. 7, respectively. These intersection points define decoding points that specify a prescribed edge transition (e.g., a positive edge transition) in an input signal having exceeded a mid-peak voltage value. In particular, the offset signals C_S and CB_S cross the input signals CB and C, respectively, at an appropriate slew rate such that the intersection points a, b, c, and d provide an ideal point for "slicing" the MLT-3 signal defined by the differential inputs C and CB into two halves of the NRZI data.

Figure 6:
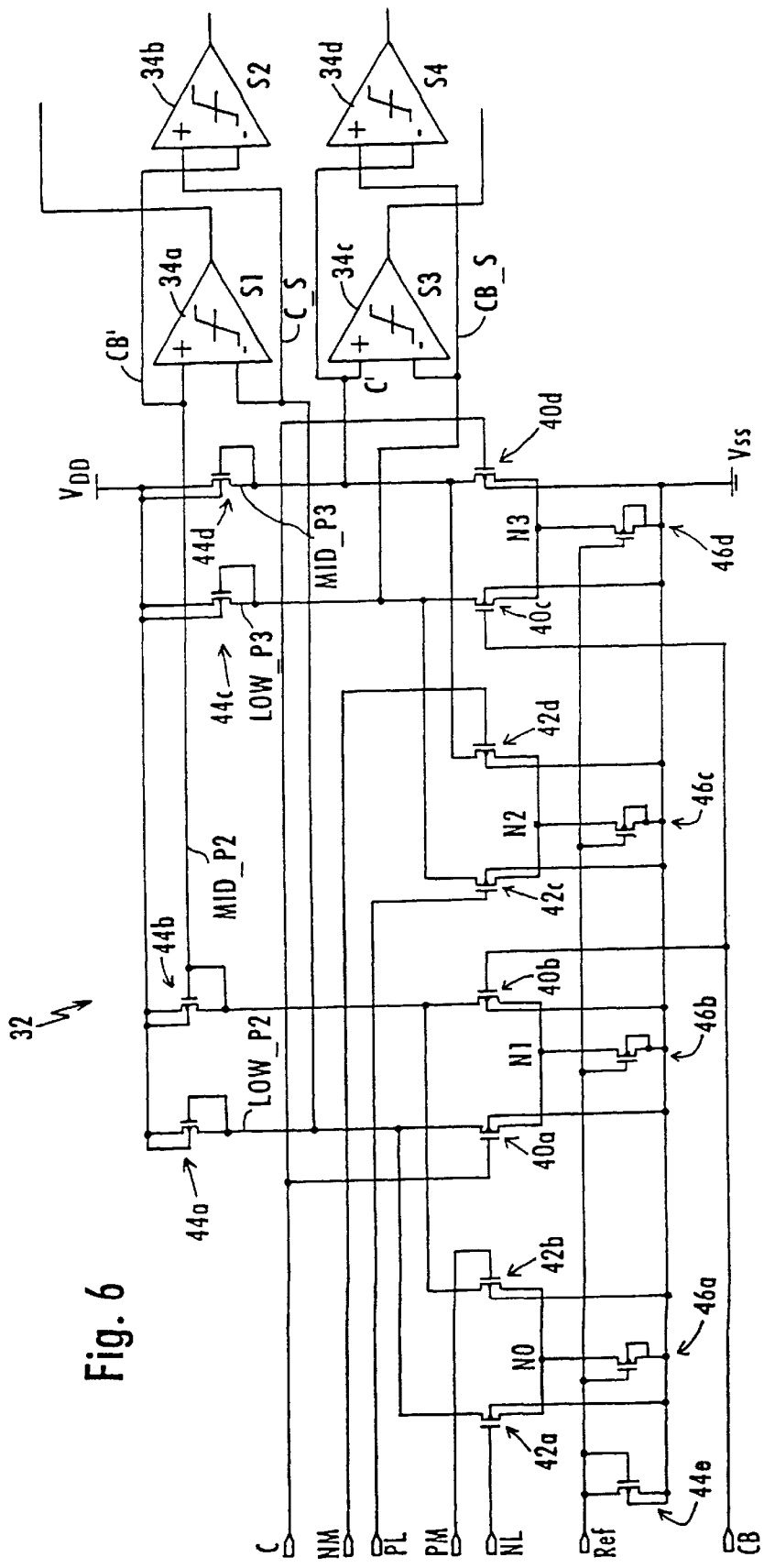
FIG. 6 is a schematic diagram illustrating in detail the biasing circuit of FIG. 5.

FIG. 6 is a schematic diagram illustrating one possible implementation of the biasing circuit 32. As shown in FIG. 6, the biasing circuit 32 includes a plurality of primary transistors 40, offset current transistors 42, load transistors 44, and voltage-controlled transistors 46. The biasing circuit 32 receives voltage signals indicating median amplitudes and negative peak values for the primary multiple level signal C and the inverted multiple level signal CB. Specifically, the biasing circuit 32 receives from a signal amplitude detection circuit (not shown) a signal NM specifying the median amplitude for signal CB, where the median is defined as the voltage between the peak-to-peak voltage values of CB. The biasing circuit 32 also receives a signal PM that specifies the median amplitude for the primary multiple level signal C. The biasing circuit also receives a signal NL that specifies the negative peak value for signal C, and a signal PL specifying the negative peak value for signal CB.

The signals NM, PM, NL, and PL, illustrated in FIG. 8 with respect to signals C and CB, are used by the biasing circuit 32 to perform voltage leveshishifting of the primary multiple level signal C and the inverted multiple level signal CB to obtain the offset primary multiple level signal C_S and the offset inverted multiple level signal CB_S. As described below, the biasing circuit 32 also is configured for generating an adjusted primary multiple level signal (C') and an adjusted inverted multiple level signal (CB') that compensates for any offset in the input signals C and CB as specified by signals NM and PM.

As shown in FIG. 6, the transistors 40, 42, 44, and 46 are preferably CMOS transistors. The transistors 46a, 46b, 46c, and 46d are voltage controlled current sources, each configured for outputting a predetermined current, for example 20 microamps. For example, if the transistor 46a outputs 50 microamps of current, then based on the differences between the signals PM and NL, the 50 microamp current will flow through different branches of load transistors 44a and 44b, described below. The current through the load transistors 44a, 44b, 44c, and 44d generate a voltage drop from the drain voltage (VDD), which controls the voltages at nodes LOW_P2, MID_P2, LOW_P3, and MID_3 driving the voltages for signals C_S, CB', CB_S, and C', respectively.

The offset current transistors 42a and 42b output first and second offset currents to nodes LOW_P2 and MID_P2, respectively, also referred to as drain nodes, based on the median voltage amplitude for signal C (PM) and the negative peak voltage value for signal C (NL), respectively. The primary transistors 40a and 40b receive the primary multiple level signal C and the inverted multiple level signal CB, respectively, and output primary currents based on the drain node voltages LOW_P2 and MID_P2, respectively.

Hence, the voltage at node LOW_P2 that generates the offset signal C_S is generated based on the primary current output by transistor 40a in response to the input signal C, and the offset current output by transistor 42a in response to the negative peak value (NL) for signal C. The voltage at node MID_P2 that generates the adjusted multiple level signal CB' is generated based on the primary current output by transistor 40b in response to the input signal CB, and the offset current output by transistor 42b in response to the median amplitude value (PM) of signal C. Hence, if signals C and CB have the same value (e.g., 0 volts), then the two nodes LOW_P2 and MID_P2 will have different voltage values due to the signals PM and NL having different voltage values. Consequently, the primary transistors 40a and 40b will not switch the comparators 34a and 34b unless the transistors 40a and 40b can build a potential that overcomes the current supplied by offset current transistors 42a and 42b.

Similarly, the offset signal CB_S is generated based on the currents flowing into load transistor 44c, based on a primary current from the primary transistor 40c in response to the signal CB, and an offset current from the current offset transistor 42c in response to the negative peak value for signal CB (e.g., signal PL). The adjusted multiple level signal C' is generated based on the input level signal C and the signal NM driving the primary and offset currents from transistors 40d and 42d, respectively, into load transistor 44d.

Hence, the bias circuit 32 enables voltage offset to be added to the input signals C and CB to generate offset signals C_S and CB_S and adjusted signals C'and CB', without adversely affecting the input bandwidth of the decoder circuit 30. Since all the transistors 40, 42, 44, and 46 are operating in current mode, the transistors can operate at a relatively high speed. As described below, the comparators 34 also switch only once every two cycles, and have no hysteresis requirement. Hence, the decoder circuit 30 can decode high-speed data (e.g., 125 MHz–250 MHz) using CMOS technology.

Operation of the decoder circuit 30 will now be described with respect to FIGS. 5 and 7. It will be assumed that the voltage values NM and PM are substantially equal to zero volts, such that C' equals C and CB' equals CB. The comparators 34a, 34b, 34c, and 34d are configured for detecting a prescribed edge transition (e.g., a positive edge) relative to a respective mid-peak voltage value in signals CB, C_S, C, and CB_S.

FIG. 7 illustrates the relationship between the inverted multiple level signal CB and the offset primary multiple level signal C_S, and the relationship between the primary multiple level signal C and the offset multiple level signal CB_S. The signals C and CB_S intersect at points a and b. As described above, the signal CB_S is generated by shifting the signal CB relative to the negative peak value (PL) for signal CB. Hence, the intersection points a and b define the decoding points, i.e., the mid-peak levels for the positive edge transitions of signals C and CB_S, respectively. Similarly, the intersection points c and d define the mid-points of the positive edge transitions of the inverted multiple level signal CB and the offset primary multiple level signal C_S, respectively.

Hence, the comparator 34c identifies the decoding point a when the primary multiple level signal C has a value greater than the offset inverted multiple level signal CB_S, at which point the comparator 34c asserts the output comparison signal S3 at event 50. Note that the comparison signal S3 has a relatively sharp edge due to the combined slew rates between the rising edge of signal C and the falling edge of signal CB_S. Since the comparator 34d also compares the signals C and CB_S according to an inverted input polarity, the comparator 34 deasserts its comparison signal S4 substantially near event 50 (e.g., event 50'), and asserts the comparison signal S4 at intersection point b at event 52. Similarly, the comparator 34a asserts its comparison signal S1 at event 54, corresponding to intersection point c, when the rising edge of signal CB exceeds the falling edge of signal C_S. Conversely, comparator 34b asserts the comparison signal S2 at event 56 (coincident with decoding point d) when the rising edge of C_S exceeds the falling edge of CB.

The comparator signals S1, S2, S3, and S4 are output to edge detection circuits 36a, 36b, 36c, and 36d, respectively. Each edge detection circuit is configured for detecting a prescribed edge transition, in this case a positive edge transition, in the corresponding comparison signal. Each edge detection circuit includes an inverter gate 60 for outputting an inverted comparison signal a predetermined interval after receiving the corresponding positive edge-triggered comparison signal (e.g., S1). Each edge detection circuit 36 also includes a NAND gate 62 for outputting a pulse signal (e.g., SA) in response to the inverted comparison signal and the corresponding positive edge-triggered comparison signal. The inverter gate 60 outputs the inverted comparison signal at a predetermined interval based upon the corresponding propagation delay, for example 3 nanoseconds, ensuring that the pulse signal (SA, SB, SC, or SD) has a sufficient pulsewidth to enable triggering of the edge decoding logic 38.

As shown in FIG. 7, the comparison signal S3 causes the edge detection circuit 36c to output the pulse signal (SC) at event 50 at a pulsewidth of, for example, 3 nanoseconds. Similarly, the positive edges of comparator signals S4, S1, and S2 cause the edge detection circuits 36d, 36a, and 36b to output the pulse signals SD, SA, and SB at events 52, 54, and 56, respectively.

The edge decoding logic 38 includes a first latch 64b receiving the pulse signals SC and SD from the edge detection circuits 36c and 36d, respectively. As shown in FIG. 7, the pulses SC and SD reset and set the latch 64b at events 50 and 52, respectively, resulting in the negative data logic signal DATANL. Similarly, the pulses SA and SB output by the edge detection circuits 36a and 36b cause the resetting and setting of the latch 64a at events 54 and 56, respectively, resulting in the positive logic data signal DATAPL.

The DATAPL and DATANL signals are supplied from the respective latches 64a and 64b to a NAND gate 66 via respective inverter gates 68a and 68b, resulting in a logical OR operation of the data values stored in the latches 64a and 64b to obtain the NRZI signal.

According to the disclosed embodiment, a plurality of comparators are used to identify a corresponding edge transition for an input signal in a prescribed direction. Since there are four comparators used to slice the data in the decoding process, each comparator defines one and only one edge transition, either as a rising edge or a falling edge. The cross-connections between comparators enable the threshold at each slicing point to match other slicing points precisely, thus eliminating the common problem of duty cycle distortion in the decoding process. Hence, the jitter in the decoded NRZI signal is minimized.

The disclosed embodiment also enables high speed operation with CMOS process transistors. Since all the transistors of FIG. 6 operate in current mode and the remaining decoding logic deals with mainly digital signals, the design is capable of very high speed operation. The prior art decoding schemes such as shown in FIG. 2A required a critical threshold design (e.g., accurate thresholds with minimum hysteresis) due to switching twice (rising and falling edges) in each cycle. The disclosed embodiment, however, requires each comparator 34 to switch only once every two cycles, and does not have any hysteresis requirement. For example, as shown in FIG. 7, the decoding logic 38 generates the NRZI signal based on the positive edge transitions of the comparator signals S1, S2, S3, and S4, and disregards the respective falling edges of the comparator signals at events 50', 52', 54', and 56'. Hence, the operational speed of the decoder 30 can theoretically be increased by four times, greatly extending the value of the CMOS technology.

The disclosed embodiment also provides accurate slicing point control, since the crossover rate of compared signals for a given comparator 34 is twice the slew rate normally encountered in the prior art comparator systems, the fast threshold crossover allows the comparator 34 to respond in a relatively small time window, resulting in less NRZI data jitter.

Although the disclosed embodiment is described with respect to detection of positive edge transitions, it will be recognized that the disclosed embodiment also is applicable for detection of negative edge transitions.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A decoder for decoding, into a bilevel signal, a differential pair of multiple level signals including a primary multiple level signal and an inverted multiple level signal, the decoder comprising:

a biasing circuit for offsetting the primary multiple level signal and the inverted multiple level signal by respective mid-peak voltage values and in response outputting respective offset multiple level signals including an offset primary multiple level signal and an offset inverted multiple level signal;

a plurality of comparator circuits, each configured for outputting comparison signals in response to a detection of a prescribed edge transition crossing the corresponding mid-peak voltage values in a corresponding one of the multiple level signal, the inverted multiple level signal, the offset multiple level signal, and the offset inverted multiple level signal;

edge detection circuits, each configured for detecting the prescribed edge transition in a corresponding one of the comparison signals; and edge decoding logic for outputting the bilevel signal in response to the detected edge transitions in the comparison signals.

2. The decoder of claim 1, wherein the biasing circuit comprises:

first and second primary transistors, responsive to the primary multiple level signal and the inverted multiple level signal, for outputting first and second primary currents based on first and second drain node voltages, respectively;

first and second offset current transistors for outputting first and second offset currents to first and second drain nodes based on negative peak values of the primary multiple level signal and the inverted multiple level signal, respectively, the mid-peak voltage values of the multiple level signals based on the respective negative peak values; and first and second load transistors for generating the first and second drain node voltages at the first and second drain nodes as the offset primary multiple level signal and the offset inverted multiple level, respectively, based on the respective first and second primary currents and first and second offset currents, relative to a supplied drain voltage.

3. The decoder of claim 2, wherein the biasing circuit further comprises:

third and fourth primary transistors, responsive to the primary multiple level signal and the inverted multiple level signal, for outputting third and fourth primary currents based on third and fourth drain node voltages, respectively;

third and fourth offset current transistors for outputting third and fourth offset currents to third and fourth drain nodes based on midlevel values of the inverted multiple level signal and the primary multiple level signal, respectively, the negative peak values and the midlevel values establishing the respective mid-peak voltage values of the primary multiple level signal and the inverted multiple level signal; and third and fourth load transistors for generating the third and fourth drain node voltages at the third and fourth drain nodes as an adjusted primary multiple level signal and an adjusted inverted multiple level signal output to the comparator circuits, respectively, based on the respective first and second primary currents and first and second offset currents, relative to a supplied drain voltage.

4. The decoder of claim 3, wherein the comparator circuits comprise;

a first comparator circuit for outputting the corresponding comparison signal as a first positive edge-triggered signal in response to the adjusted primary multiple level signal having a voltage greater than the offset inverted multiple level signal;

a second comparator circuit for outputting the corresponding comparison signal as a second positive edge-triggered signal in response to the adjusted inverted multiple level signal having a voltage greater than the offset primary multiple level signal;

a third comparator circuit for outputting the corresponding comparison signal as a third positive edge-triggered signal in response to the offset primary multiple level signal having a voltage greater than the adjusted inverted multiple level signal; and a fourth comparator circuit for outputting the corresponding comparison signal as a fourth positive edge-triggered signal in response to the offset inverted multiple level signal having a voltage greater than the adjusted primary multiple level signal.

5. The decoder of claim 4, wherein the edge detection circuits each comprise:

an inverter gate for outputting an inverted comparison signal at a predetermined interval after receiving the corresponding positive edge-triggered comparison signal; and a NAND gate for outputting a pulse signal in response to the inverted comparison signal and the corresponding positive edge-triggered comparison signal, the pulse signal identifying the corresponding prescribed edge transition in the corresponding comparison signal.

6. The decoder of claim 5, wherein the edge decoding logic comprises:

a first latch receiving the pulse signals corresponding to the second and third positive edge-triggered comparison signals, respectively; and a second latch receiving the pulse signals corresponding to the first and fourth positive edge-triggered comparison signals, respectively;

wherein the bilevel signal is generated based on output signals from the first and second latches.

7. The decoder of claim 5, wherein each inverter gate outputs the inverted comparison signal approximately three nanoseconds after receiving the corresponding positive edge-triggered comparison signal, the differential pair of multiple level signals having a data rate of approximately 125 MHz.

8. The decoder of claim 7, wherein the edge decoding logic outputs the bilevel signal as a 125 MHz digital signal.

9. The decoder of claim 8, wherein the bilevel signal is a Non_Return to Zero Interface (NRZI) format signal.

10. The decoder of claim 7, wherein the differential pair of multiple level signals are encoded according to Multiple Layer Transition (MLT-3) protocol.

11. The decoder of claim 1, wherein the comparator circuits comprise:

a first comparator circuit for outputting the corresponding comparison signal as a first positive edge-triggered signal in response to the primary multiple level signal having a voltage greater than the offset inverted multiple level signal;

a second comparator circuit for outputting the corresponding comparison signal as a second positive edge-triggered signal in response to the inverted multiple level signal having a voltage greater than the offset primary multiple level signal;

a third comparator circuit for outputting the corresponding comparison signal as a third positive edge-triggered signal in response to the offset primary multiple level signal having a voltage greater than the inverted multiple level signal; and a fourth comparator circuit for outputting the corresponding comparison signal as a fourth positive edge-triggered signal in response to the offset inverted multiple level signal having a voltage greater than the primary multiple level signal.

12. The decoder of claim 1, wherein the edge detection circuits each output a pulse signal in response to a detected positive edge transition in the corresponding comparison signal.

13. The decoder of claim 12, wherein the edge decoding logic changes a polarity of the bilevel signal in response to each said pulse signal.

14. The decoder of claim 12, wherein the multiple level signals have a 125 MHz data rate, said each edge detection circuit outputs said pulse signal having approximately a three nanosecond pulsewidth.

15. A decoder for decoding, into a bilevel signal, a differential pair of multiple level signals including a primary multiple level signal and an inverted multiple level signal, the decoder comprising:

a voltage biasing circuit for offsetting the primary multiple level signal and the inverted multiple level signal as an offset primary multiple level signal and an offset inverted multiple level signal, respectively, based on detected voltage characteristics of the primary multiple level signal and the inverted multiple level signal;

a first comparator circuit configured for outputting a first comparison signal in response to the primary multiple level signal having a value greater than the offset inverted multiple level signal;

a second comparator circuit configured for outputting a second comparison signal in response to the offset primary multiple level signal having a value greater than the inverted multiple level signal;

a third comparator circuit configured for outputting a third comparison signal in response to the offset inverted multiple level signal having a value greater than the primary multiple level signal;

a fourth comparator circuit configured for outputting a fourth comparison signal in response to the inverted multiple level signal having a value greater than the offset primary multiple level signal;

edge detection circuits, each configured for detecting a prescribed edge transition in a corresponding one of the comparison signals; and edge decoding logic for outputting the bilevel signal in response to the detected edge transitions in the comparison signals.

16. The decoder of claim 15, wherein the edge detection circuits each comprise:

an inverter gate for outputting an inverted comparison signal a predetermined interval after receiving the corresponding comparison signal; and a NAND gate for outputting a pulse signal in response to the inverted comparison signal and the corresponding comparison signal, the pulse signal identifying the corresponding prescribed edge transition in the corresponding comparison signal.

17. The decoder of claim 16, wherein the edge decoding logic comprises:

a first latch receiving the pulse signals corresponding to the first and third comparison signals, respectively; and a second latch receiving the pulse signals corresponding to the second and fourth comparison signals, respectively;

wherein the bilevel signal is generated based on output signals from the first and second latches.

18. The decoder of claim 16, wherein each inverter gate outputs the inverted comparison signal approximately three nanoseconds after receiving the corresponding comparison signal, the differential pair of multiple level signals having a data rate of approximately 125 MHz.

19. The decoder of claim 15, wherein the edge detection circuits each output a pulse signal in response to a detected positive edge transition in the corresponding comparison signal.

20. The decoder of claim 19, wherein the edge decoding logic changes a polarity of the bilevel signal in response to each said pulse signal.

21. A method for decoding a differential pair of multiple level signals, including a primary multiple level signal and an inverted multiple level signal, into a bilevel signal, the method comprising:

generating an offset primary multiple level signal based on the inverted multiple level signal, and an offset inverted multiple level signal based on the primary multiple level signal;

detecting first and second decoding points based on respective first and second intersection points between the primary multiple level signal and the offset inverted multiple level signal;

detecting third and fourth decoding points based on respective third and fourth intersection points between the inverted multiple level signal and the offset primary multiple level signal; and generating the bilevel signal based on prescribed edge transitions in the primary multiple level signal, the offset inverted multiple level signal, the inverted multiple level signal and the offset primary multiple level signal coinciding with the first, second, third, and fourth decoding points, respectively.

22. The method of claim 21, wherein the step of detecting the first and second decoding points comprises:

supplying the primary multiple level signal and the offset inverted multiple level signal to first and second comparators, according to respective first and second polarity inputs;

outputting first and second comparison signals from the first and second comparators, respectively, each of the first and second comparison signals having a prescribed edge transition based on comparison of the primary multiple level signal and the offset inverted multiple level signal according to the corresponding polarity input; and generating first and second one-shot pulses, identifying the first and second decoding points, in response to detection of the prescribed edge transitions in the first and second comparison signals, respectively.

23. The method of claim 22, wherein the bilevel signal generating step comprises generating a binary signal by asserting the bilevel signal in response to the first one-shot pulse and deasserting the bilevel signal in response to the second one-shot pulse.

* * * * *